United States Patent
Yahagi et al.

[11] Patent Number: 6,048,601
[45] Date of Patent: Apr. 11, 2000

[54] SOFT MAGNETIC ALLOY POWDER FOR ELECTROMAGNETIC AND MAGNETIC SHIELD, AND SHIELDING MEMBERS CONTAINING THE SAME

[75] Inventors: Shin'ichiro Yahagi, Ohbu; Akihiko Saito, Nagoya; Michiharu Ogawa, Mie-ken, all of Japan

[73] Assignee: Daido Steel Co., Ltd., Aichi-ken, Japan

[21] Appl. No.: 09/009,256

[22] Filed: Jan. 20, 1998

[30] Foreign Application Priority Data

| Jan. 20, 1997 | [JP] | Japan | 9-019611 |
| Sep. 1, 1997 | [JP] | Japan | 9-250143 |
| Nov. 13, 1997 | [JP] | Japan | 9-312402 |

[51] Int. Cl.[7] .................. B32B 5/02; C08K 3/08; C22C 38/18
[52] U.S. Cl. .......... 428/147; 428/148; 428/328; 428/343; 428/401; 428/900; 428/920; 524/440; 524/441; 523/137; 420/40; 420/62; 420/104; 252/601; 174/35 MS; 174/35 R
[58] Field of Search ............ 428/147, 148, 428/900, 920, 328, 343, 401; 148/301, 309; 420/40, 62, 104; 174/35 MS, 35 R; 106/18.26; 252/601; 523/137; 524/434, 435, 439, 440, 441

[56] References Cited

U.S. PATENT DOCUMENTS

| 4,111,882 | 9/1978 | Deatcher | 260/30.6 R |
| 4,946,746 | 8/1990 | Ichiryu et al. | 428/606 |
| 5,252,148 | 10/1993 | Shigeta et al. | 148/307 |
| 5,736,070 | 4/1998 | Murakami et al. | 252/512 |

*Primary Examiner*—Nasser Ahmad
*Assistant Examiner*—Derek Jessen
*Attorney, Agent, or Firm*—Kubovcik & Kubovcik

[57] ABSTRACT

Disclosed is soft magnetic alloy powder for electromagnetic and magnetic shield, which can be easily flattened and exhibits good performance over a high frequency band, and a shielding member of good shield effect prepared by dispersing the powder in a matrix of rubber or plastics. Powder of a soft magnetic alloy, which consists essentially of, by weight %, Cr: 0.5.0–20%, Si: 0.01–0.5%, Al: 0.01–20% and the balance of Fe and inevitable impurities, is flattened in an attritor, and is added to the matrix material at a content of 30 wt. % or higher, preferably, as high as possible, and processed to form sheets or molded articles. The shielding member of particularly high flame resistance is prepared by adding soft magnetic alloy powder of alloy composition consisting essentially of, by weight %, Cr: 5–14%, Si: 0.01–0.5%, Al: 0.5–20%, and preferably, REM: up to 0.5%, and the balance of Fe and inevitable impurities, after being flattened, is added to a matrix material of chlorine-containing flame resistant rubber or plastics at a high content, and processed to form sheets or molded articles.

16 Claims, 5 Drawing Sheets

SOFT MAGNETIC ALLOY POWDER FOR ELECTROMAGNETIC AND MAGNETIC SHIELD, AND SHIELDING MEMBERS CONTAINING THE SAME

BACKGROUND OF THE INVENTION

The present invention concerns soft magnetic alloy powder for electromagnetic and magnetic shield, and shielding members containing the alloy powder.

Along the rapid progress of recent technologies concerning electronic appliances such as personal computers, word-processors, facsimiles and portable telephones, various problems caused by electromagnetic waves have been drawing attention. For example, electromagnetic wave generated by the parts such as IC and LSI causes erroneous working of appliances or become obstacles to wireless communication. Also, magnetic field generated by cables for power supply, electric motors or superconductive magnets influence on measuring instruments, sensors and electric/electronic circuits. As the means for solving these problems various magnetic shield and electromagnetic shield are used, and materials for the shield have been developed.

For the purpose of shielding electromagnetic wave and magnetic field (hereinafter represented by electromagnetic waves and referred to simply as "shield" or "shielding") use of plates of a metal having high magnetic permeability and saturation magnetic flux density such as permalloy is effective. However, if it is intended to cover and separate the space, in which electronic circuits or computers are installed, and from which influence of the electromagnetic wave must be excluded, with rolled plates of permalloy or the like, a shielding member itself will be considerably heavy. Also, it will be sometimes necessary to cut, bend or even weld the plates. This is laborious work and increases costs for shielding.

In general, alloys of high magnetic permeability and saturation magnetic flux density are expensive. The above mentioned processing causes distortion in the metal structure at the processed parts and results in lowering of shield properties. Because of this reason, plates of magnetic alloys are not so often used as the material for magnetic shield.

Then, as the material for magnetic shield which is easy to process and used for covering, there has been used paints prepared by suspending flat particles of the magnetic alloy having high magnetic permeability and saturation magnetic flux density in an appropriate vehicle, painted materials prepared by painting said paint on a suitable flexible support, or sheets prepared by dispersing the flat particles in a matrix of an organic material.

Shielding members of this kind using soft magnetic alloy powder disclosed to date are as described below. First examples are magnetic shielding paint prepared by crushing a soft magnetic amorphous alloy and mixing the resulting flat particles with a high polymer substance (Japanese Patent Disclosure No. 59-201493), and paint for magnetic shield prepared by mixing flat particles of high magnetic permeability alloy in a high polymer substance (Japanese Patent Disclosure No. 58-59268). In these paints the soft magnetic material powder should be of an aspect ratio as large as possible, or flat in the shape. Shield will be effective if the particles are placed in such direction that flat faces are rectangular to the direction of electromagnetic wave. This will ensure insulating property of the shielding material at the same time of the shielding effect.

Another paint for shield published comprises flat, but irregular particles of Fe—Ni alloys, Fe—Ni—Co alloys, Fe—Si—Al alloys and Fe—Ni—Mo alloys, or permalloy, molybdenum permalloy and sendust, suspended in high molecular substance matrix (Japanese Patent Publication No. 62-58631). The publication contains magnetic shield film using permalloy. Further proposal was to use coating films of magnetic iron containing one of Cr: 0.5–20 wt. %, Si: 0.5–9 wt. % and Al: 0.5–15 wt. % for shielding protection.

Also disclosed were a soft magnetic powder for magnetic shield, which is a flat, soft magnetic particles having an alloy composition falling in the pentagonal defined by the following points A, B, C, D and E in a ternary system of Fe, Si and Cr:

A: $Fe_{78}Si_{22}Cr_0$
B: $Fe_{70}Si_{30}Cr_0$
C: $Fe_{60}Si_{30}Cr_{10}$
D: $Fe_{63}Si_{18}Cr_{19}$
E: $Fe_{76}Si_{18}Cr_6$ a method of producing the powder and magnetic shielding members comprising the powder and a binder.(Japanese Patent Disclosure No. 3-295206)

Still other disclosure concerns a electromagnetic wave interference suppresser made by coating one or both surfaces of an electroconductive support with insulating soft magnetic layer which comprises flat fine powder of a soft magnetic material such as Fe—Al—Si alloy and an organic binder. (Japanese Patent Disclosure No. 7-212079)

Flattening of the powders of soft magnetic amorphous alloys, permalloy and molybdenum permalloy used in the know technologies requires long period for processing and productivity is low. Moreover, distortion by processing is large, and therefore, it is difficult to achieve high magnetic shield effect. Flake type sendust alloy has saturation magnetic flux constant of about $0.3 \times 10^{-6}$ or less, but not zero, and therefore, when used as magnetic shield material, stress during flattening step or at use lowers the magnetic properties and thus magnetic shield effect as expected cannot be obtained.

Soft magnetic powder for magnetic shield of the above described Fe—Si—Cr alloy has high deformation resistance and require long period of time for flattening the powder. Due to insufficient corrosion resistance $O_2$-content of the powder increases during the flattening step as shown in FIG. 6, and the increase of $O_2$-content causes increase of coercive force at D.C. and decrease of permeability as shown in Fig, 7. This results in lowered effect to shield electromagnetic wave and magnetic field.

The above mentioned shield material prepared by coating insulating soft magnetic layer of a mixture of Fe—Al—Si alloy flat fine powder and an organic binder has a drawback that, due to difficulty in flattening the alloy, it is difficult to heighten effect to shield the electromagnetic wave.

The inventors proposed some kinds of shield material for electromagnetic wave having flexibility prepared by dispersing powder of soft magnetic material in a matrix of rubber or synthetic resin.

It is current demand that electromagnetic shield materials maintain shield effect at such a high frequency band as 1 GHz or higher, which has been necessitated by elevating clock speed of personal computers. Thus, choice of the alloy composition, powder shape and size of the soft magnetic material is important.

On the other hand, depending on the aspect of use, flame resistance is often required to the electromagnetic shield materials. In case where the material is used for ordinary electronic appliances such as personal computers, it is sufficient that the material meets V1 standard of flame resistance test, while in case home electric appliances it is requested that the material meets V0 standard, i.e., flame resistance of such extent that burning caused by a burner flame extinguishes when the flame is withdrawn. Conventional sheets for electromagnetic shield could not achieve the V0 standard even if flame resistant grade of chlorinated polyethylene prepared by incorporating a flame retarder such as antimony trioxide is used as the matrix material.

SUMMARY OF THE INVENTION

A basic object of the present invention is to provide a soft magnetic alloy powder for electromagnetic and magnetic shield which can be easily flattened. A further basic object of this invention is to provide shielding members of high effect of electromagnetic and magnetic shield with use of this soft magnetic alloy powder A specific object of this invention is to provide a soft magnetic alloy powder for electromagnetic shield which can be used in such a high frequency band as 1 GHz or so without lowering the performance. A further specific object of this invention is to provide molded articles or sheets made by dispersing the above soft magnetic alloy powder in a matrix of rubber or plastics which exhibit high flame resistance.

DETAILED EXPLANATION OF THE PREFERRED EMBODIMENTS

Figure 1:
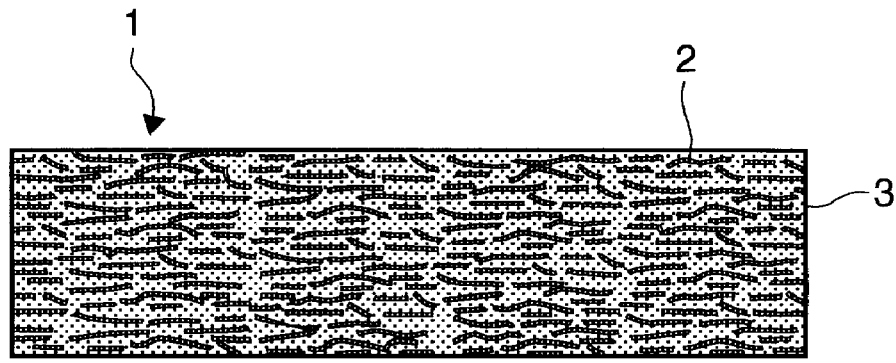
FIG. 1 is a conceptional cross section view of an example of shielding sheet of the present invention.

The inventors discovered, in the process of research on Fe—Cr based alloys to attain the above objects, that a novel alloy resulting from addition of both Si and Al to Fe—Cr alloy exhibits deformation resistance lower than that of Fe—Cr—Si alloy and nearly equal to that of Fe—Cr—Al alloy, and that powder of the Fe—Cr—Si—Al alloy has a corrosion resistance better than that of the Fe—Cr—Si alloy.

The soft magnetic alloy powder of the present invention for electromagnetic and magnetic shield (hereinafter referred to as "soft magnetic powder for shield" or simply "soft magnetic powder") is based on the above discovery and has a basic alloy composition consisting essentially of, by weight %, Cr: 0.5–20%, Si: 0.001–0.5%, Al: 0.01–20% and the balance being Fe and inevitable impurities.

In the soft magnetic powder for shield those for attaining the above noted specific object has an alloy composition, in the basic embodiments, consisting essentially of, by weight %, Cr: 5–14%, Si: 0.01%–0.5%, Al: 0.5–20%, wherein the value of Cr %+3Al % is 30 or higher, and the balance of Fe and inevitable impurities. In the range of this alloy composition preferable composition is Cr: 6–8%, Si: 0.01%–0.2%, Al: 6–16% and the balance of Fe and inevitable impurities.

In an alternative and preferred embodiment of the above embodiments for the specific object the alloy composition consists essentially of, by weight %, Cr: 5–14%, Si: 0.01%–0.5%, Al: 0.5–20% and REM: up to 0.5%, wherein the value of Cr %+3Al % is 30 or higher, and the balance of Fe and inevitable impurities.

In the specification the term "REM" means Y and La-series rare earth metals, which may be, as those conventionally used, a mixture of two or more of the elements.

The shielding member for electromagnetic and magnetic shield according to the present invention (hereinafter referred to as "shielding member") is prepared by dispersing the above described soft magnetic alloy powder which consists essentially of, by weight %, Cr: 0.5–20%, Si: 0.001–0.5%, Al: 0.01–20% and the balance of Fe and inevitable impurities in a flexible matrix of rubber or plastics and processing to shaped articles. A representative shape of this shielding member is a sheet (hereinafter referred to as "shielding sheet")

The shielding sheet of the present invention may have a layer of an adhesive on whole or a part of its surface or surfaces.

The shielding sheet of the present invention may have plural projecting points or lines on whole or a part of its surface or surfaces.

The basic embodiment of the shielding member of this invention which achieves the above noted specific object is a flame resistant shielding member, particularly, in the form of a sheet, which is prepared by dispersing a soft magnetic alloy powder consisting essentially of, by weight %, Cr: 5–14%, Si: 0.01–0.5%, Al: 0.5–20%, wherein the value of Cr %+3Al % is 30 or higher, and the balance of Fe and inevitable impurities, in a flame resistant matrix of chlorine-containing rubber or plastics. The soft magnetic alloy powder is preferably mixed in an amount of, by weight, 30% or higher in the matrix. As the matrix material, flame resistant grade of chlorinated polyethylene rubber, to which a flame retarder such as antimony trioxide is added, is preferably used.

The shielding member according to the invention may be molded articles of various shapes prepared by injection molding or products of various shapes such as plates, rods, cylinders and other profiles prepared by extrusion molding. Products which are most widely used may be in the form of sheets. Sheets can be produced by calendering usually used in production of rubber sheets. As is well known it is possible to mix large amount of powder in rubber, and therefore, calendering is a useful processing technique for the shielding sheet of the invention, in which the soft magnetic material powder should be incorporated as much as possible.

The following explains the purpose of addition of the alloy components and the reasons for limiting the alloy compositions:

Chromium is an elements added mainly for improving corrosion resistance. If the content of Cr is less than 0.5%, corrosion resistance is low. On the other hand, if the content exceeds 20%, saturation magnetic flux density will be low, and thus the content must be in the range of 0.5–20%. Preferable range is 5.0–14%.

Aluminum enhances processability of the alloy powder to flat particles, electric resistance and corrosion resistance. Al is effective to decrease content of oxygen which exerts harmful influence on the magnetic properties of the alloy, and also enhance processability of the alloy powder. Addition less than 0.01% is ineffective, while addition exceeding 20% lowers the processability to flat particles. Content of Al is thus decided to 0.01–20%. Preferable content is 0.5% or more, particularly, 6–16% for the flame resistant sheets.

In order to prepare flame resistant shielding member it is necessary to fulfill the condition that the value of Cr %+3Al % is 30 or higher. Both of chromium and aluminum strongly couple with oxygen, and thus surfaces of Fe—Cr—Al alloy is covered with a film of the oxides. According to the inventors' understanding, with respect to the flame resistance the form of the oxides in the film or the state of coupling between oxygen and the metal elements exerts rather significant influence than the amount of oxygen in the film which has been vaguely considered important. In case where powder of a soft magnetic alloy having a Cr %+3Al % value of 30 or higher is used, surfaces of the alloy powder is covered with films of fine oxides, which seem to be effective for enhancing the flame resistance of the shielding member. If powder of a soft magnetic alloy having the above value less than 30 is used, it is difficult to achieve high flame resistance as seen in the examples described below.

Silicon is added to increasing electric resistance and improve magnetic properties. To achieve this purpose addition of Si of at least 0.001% is necessary. On the other hand, addition of more than 0.5% lowers processability to flat particles. Thus, the Si content is in the range of 0.01–0.5%. Preferable range is 0.01–0.4%, particularly, 0.05–0.2%.

The following explains impurities inevitable in the present soft magnetic powder for shield of the present invention. Impurities usually inevitable in the soft magnetic alloy of the invention are carbon, manganese and phosphor.

If carbon content exceeds 0.3% results in decrease in saturation magnetic flux density, and therefore, 0.3% is the allowable upper limit. Preferable content is 0.03% or less.

Manganese is an essential element as a deoxidizer. However, content of 0.30% or higher lowers saturation magnetic flux density, and therefore, preferable content is less than 0.30%.

Both phosphor and sulfur lower, if the respective content exceeds 0.03%, processability to flat particles or corrosion resistance of the soft magnetic alloy powder, and therefore, the contents are preferably limited to 0.03% or less.

Further possible impurities, which often come from materials used and may cause problems, are copper, nickel and molybdenum. These elements, if their total content exceeds 0.10%, lower the saturation magnetic flux density of the soft magnetic alloy. Total content less than 0.05% is preferable.

Content of REM, the optional component, if added, is chosen to be not exceeding 0.5%. REM, though it is a preferable component from the view point of flame resistance, lowers processability to flat particles if added too much.

The soft magnetic alloy powder for shield used in the present invention should be of an aspect ratio of 2 or 25 higher. An aspect ratio of 10 or higher is preferable, and or higher is more preferable. This is because the higher the aspect ratio is, the more remarkable the shield effect is. Suitable particle size is: averaged length up to 100 μm, averaged width up to 60 μm and averaged thickness around 3 μm. It is easy to obtain powder having an aspect ratio of 2 or higher from the present soft magnetic alloy. The soft magnetic powder for shield of the invention can be produced by melting materials to form a molten alloy of a determined composition, and atomizing in accordance with conventional water atomizing, gas atomizing or vacuum atomizing. Flat alloy particles are obtained by flattening the above powder in an attritor (ball mill). The flattening often requires a long period of time, and it is desirable to choose the conditions under which flat particles are available in a shorter period of time. It is recommended to subject the obtained flat particles to suitable heat treatment, for example, heating at 500–1100° C. for 10–100 minutes.

The shielding sheet of the present invention is prepared by dispersing the above described soft magnetic powder for shield into a flexible insulating material or a hard insulating material in an amount of, for example, 70 wt. % or higher, preferably, 80 wt. % or higher. The product sheets are of the shapes and structures shown in FIG. 1 to FIG. 4. Needless to say it is necessary to incorporate soft magnetic alloy powder of the amount as large as possible into the matrix. At a smaller amount shielding performance will not be satisfactory. In order to accomplish shielding performance usually required it is necessary, as noted above, to add 30 wt. % or higher. The upper limit of possible incorporation will depend on various factors such as shape and size of the soft magnetic alloy powder, properties of the rubber or plastics used as the matrix material, kind and amount of a flame retarder, if used, and the way of processing. In many cases, however, it will be possible to incorporate the powder of up to 90 wt. % without encountering fatal difficulty.

FIG. 1 is a conceptional cross section view of the present shielding sheet 1, in which the soft magnetic alloy powder 2 of the invention is dispersed homogeneously in a flexible insulating material 3 The shielding sheet 1 can be produced by rolling, extrusion or injection molding.

Figure 2:
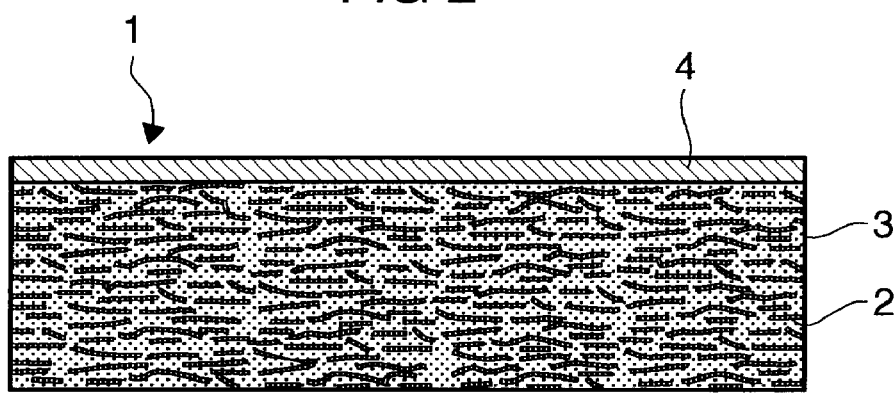
FIG. 2 is a conceptional cross section view of another example of shielding sheet of the present invention.

FIG. 2 illustrates an example of this invention, a shielding sheet, one surface of which is covered with a layer of an organic adhesive 4. Application of the adhesive layer facilitates adhesion of sheet 1 on the surfaces of the objects to be shielded, and at the same time, the sheet itself can be stored and transported in the form of a coil. The adhesive layer may be on either one side or both sides. It may be formed partly on the surface, for example, as stripes of the equal intervals or at the periphery of the sheet.

Figure 3:
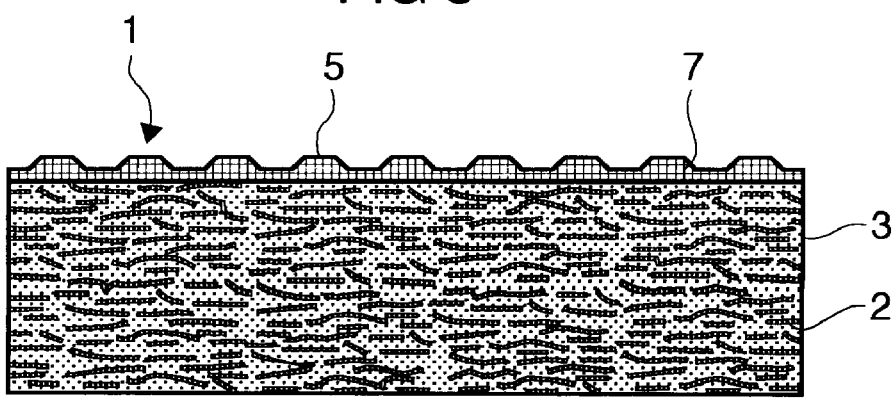
FIG. 3 is a conceptional cross section view of a further example of shielding sheet of the present invention.
Figure 4:
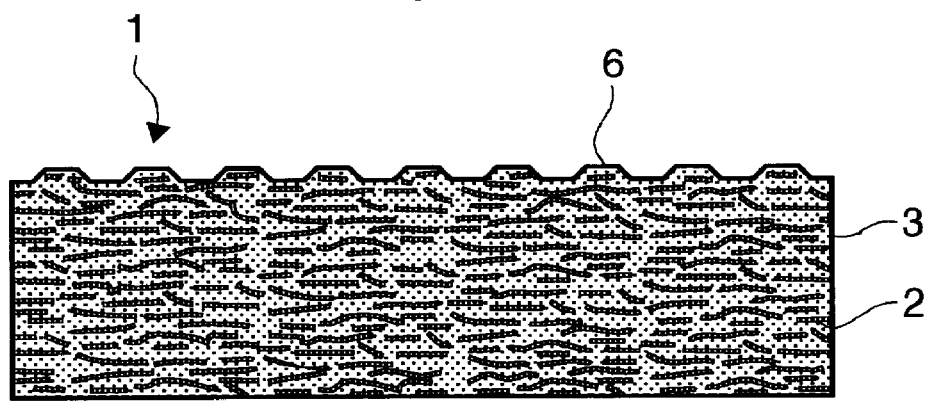
FIG. 4 is a conceptional cross section view of a still further example of shielding sheet of the present invention.

FIG. 3 and FIG. 4 are cross section views of other examples of shielding sheet 1 according to the invention, which are suitable for laying on the floors of a computer room or a shielded room. The sheet shown in FIG. 3 is a product made by laminating a thin film or sheet 7 which has non-skid projections 5 at scattered points on one surface thereof and the sheet for shielding 1 of the invention. The sheet shown in FIG. 4 is made by extrusion of the shielding sheet 1 and plural of projecting lines 6 in one body at the same time of extrusion. In these examples the shielding sheets may have the above noted adhesive layers on whole or part of the back side of the sheets. Shielding sheet 1 illustrated in FIG. 4 may, if cut along the lines rectangular to the longitudinal direction of the sheet, form various patterns, when laid on a floor, by alternating the directions of the projecting lines 6 of each cut sheets.

Examples of the flexible or the hard insulating materials suitable for the present shielding sheet are: natural rubber; synthetic rubber such as chloroprene rubber, polybutadiene rubbur, polyisoprene rubber, ethylene-propylene rubber, butadiene-acrylonitrile rubber, isobutylene-isoprene rubber, styrene-butadiene rubber and chlorinated polyethylene rubber; flexible or hard synthetic resins such as phenol resin, epoxy resin, various polyester resins, acryl resin, polyvinylacetate resin, polystyrene resin, polypropylene resin, polyurethane and polycarbonate resin.

The soft magnetic alloy powder of the present invention has high permeability, which is required for achieving shield effect to electromagnetic wave and magnetic field, as well as good corrosion resistance. The powder can be flattened so easily that it is possible to obtain powder having an aspect ratio of 20 or higher. Content of oxygen in the soft magnetic alloy powder is inherently low and increase thereof during flattening is small. Therefore, increase of coercive force is not so large, and as the result, decrease of the permeability necessary for shield effect is small. Thus, the present invention provides Fe—Cr—Al soft magnetic alloy powder which retains electromagnetic shield effect to a high frequency band.

The shielding member according to the present invention using the above soft magnetic powder exhibits high shield effect to electromagnetic wave and magnetic field, and less expensive. Of the shielding sheets according to the invention flexible products may be used by wrapping, covering, laying or adhesion meeting the electromagnetic wave and sources thereof and depending on the shapes, sizes and surrounding space of the objects to be shielded.

A particular significance of the present invention is to provide an electromagnetic shielding member having a very high flame resistance which has been considered to be difficult to realize. Without extremely increasing addition amount of a flame retarder to the matrix, i.e., without significantly reducing processability of the composition, it is easy to meet the standard of UL94-V1. If sufficient mount of flame retarder is used, it is possible to meet V0 standard. Thus, the present invention fulfills the severe demand for flame resistance to the shielding members which is applied to the parts of various office automation equipment and home electric appliances requiring electromagnetic shield

EXAMPLES

Example 1

Powders of soft magnetic alloys according to the present invention having the alloy compositions shown in Table 1 below and conventional soft magnetic alloys for comparison were prepared by water atomizing of molten alloys. The alloy powders were charged in a plastic vessel of inner diameter 5 mm and depth 5 mm to determine magnetic flux and magnetic permeability with a VSM (vibration sample magnetometer). Measured values are shown in Table 2 below.

TABLE 1

| No. | Cr | Si | Al | Fe and invetiable impurities |
|---|---|---|---|---|
| Invention | | | | |
| 1 | 7.2 | 0.1 | 9.6 | balance |
| 2 | 3.2 | 0.1 | 3.2 | balance |

TABLE 1-continued

| No. | Cr | Si | Al | Fe and invetiable impurities |
|---|---|---|---|---|
| 3 | 5.0 | 0.1 | 5.0 | balance |
| 4 | 0.5 | 0.1 | 5.0 | balance |
| 5 | 13 | 0.1 | 0.1 | balance |
| 6 | 13 | 0.1 | 0.5 | balance |
| 7 | 13 | 0.1 | 1.0 | balance |
| 8 | 13 | 0.1 | 3.0 | balance |
| Control | | | | |
| 9 | 7 | 12 | 0 | balance |
| 10 | 2 | 12 | 0 | balance |

Corrosion resistance of the powders was evaluated by standing still the powders in a constant temperature chamber under a humidity 40% for 100 hours, and inspecting occurrence of rust.

Powder of averaged particle size of about 10 μm was classified from the above powder and subjected to flattening in an attritor. Period of time necessary for achieving aspect ratio of 25 or higher was recorded. The data are shown in Table 2 in the column of "flattening period".

The flat particles thus produced was annealed by heating in an inert gas atmosphere at 800° C. for 120 minutes. Compounds were prepared by mixing these powders (averaged particle size 10 μm, averaged smaller diameter 1 μm, averaged thickness 1 μm and aspect ratio 10 or larger) 65 vol. % and chlorinated polyethylene 35 vol. % and dispersing the former uniformly in the latter. The compounds were processed to a shielding sheet of thickness 1 mm, width 150 mm and length 200 mm.

The shielding sheets were rolled to form cylinders of diameter 50 mm and height 150 mm. The cylinders were placed between a pair of confronting Helmholz coils, and alternating current of 50 Hz was posed to one of the coils to form an alternating magnetic field of 1 Gauss. A gaussmeter was inserted in the above cylinder formed by the sheet for shield to measure attenuation factors. The results are shown in Table 2.

TABLE 2

| No. | Magnetic Flux B30 (KG) | Magnetic Permeability | Corrosion Resistance | Flattening Period (hr) | Shield Effect (%) |
|---|---|---|---|---|---|
| Invention | | | | | |
| 1 | 12 | 17 | excellent | 10.1 | 59 |
| 2 | 14 | 21 | good | 7.5 | 76 |
| 3 | 13 | 20 | excellent | 8.3 | 86 |
| 4 | 14 | 21 | excellent | 8.0 | 70 |
| 5 | 13 | 20 | good | 7.1 | 65 |
| 6 | 14 | 19 | acceptable | 7.4 | 65 |
| 7 | 13 | 19 | acceptable | 7.5 | 64 |
| 8 | 13 | 18 | excellent | 8.2 | 61 |
| Control | | | | | |
| 9 | 11 | 15 | poor | 19.2 | 54 |
| 10 | 12 | 16 | poor | 22.3 | 58 |

The soft magnetic powders of the present invention exhibit, though the saturation magnetic flux densities are equal to or a little higher than those of conventional soft magnetic powders, permeabilities are remarkably higher than those of the conventional ones. Evaluation of corrosion resistance of the present powders is, though varies depending on the alloy compositions, always better than that of the control powders. The periods of time necessary for flattening were so remarkably reduced as to be half or less of those of the control powders. Shield effect was higher than that of the controls.

Based on these data it is concluded that the present soft magnetic powder of the invention is at every property equal or superior to that of the conventional powder, and that it is suitable for soft magnetic powder to be used for shielding.

Example 2

The above mentioned cylinder made by the shielding sheet containing soft magnetic alloy of the invention No. 7 in Example 1 was chosen as the object of this experiment. Under varied frequency of the alternating current posed on the Helmholz coil from 0.1–1,000 MHz shield effect to electromagnetic wave was determined.

For comparison a soft magnetic paint was prepared by incorporating flat powder of averaged particle size 10 µm and aspect ratio of 5 or more made of Fe—5% Al—9% Si alloy 90 wt. % with polyurethane resin 8 wt. %, curing agent (an isocyanate compound) 2 wt. % and a solvent, and the paint was applied on an OHP sheet. After drying and curing there was obtained a shielding sheet of thickness 1.2 mm, width 150 mm and length 200 mm.

The sheet was rolled to form a cylinder of diameter 50 mm and height 150 mm, which was subjected to determination of shield effect in the same method as described above. The results are shown in FIG. 5.

Figure 5:
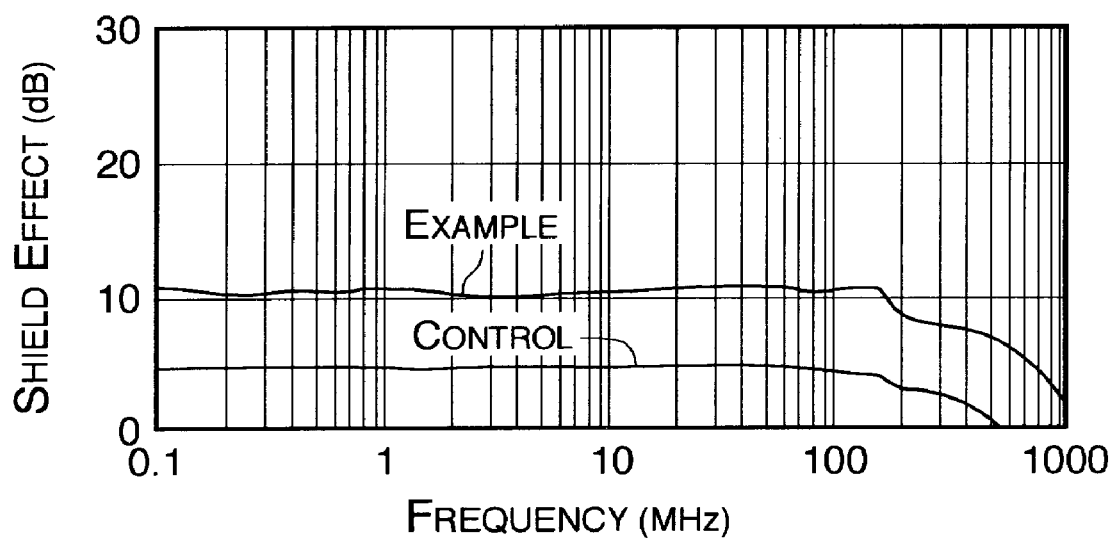
FIG. 5 is a graph showing shield effect of a shielding sheet described in Example 2 of the present invention with comparison of a control example.

The data of FIG. 5 show that the shielding sheet using a soft magnetic alloy powder of the invention exhibits attenuation of 11 dB until the frequency goes high to about 160 MHz, which is twice or more shield effect compared with attenuation of 5 dB obtained by the control example. Shield effect of the shielding sheet of the control example begins to go down at a frequency of about 80 MHz and becomes low at about 500 MHz. The present shielding sheet has better effect even to electromagnetic wave of high frequency.

Example 3

In addition to the alloy No. 1 of the invention and the control alloy No. 9 in Table 1 above, molten alloy of another composition,. Fe—13.12% Cr—0.48 % Si (hereinafter referred to as "Control No. 11" ) was prepared by melting, and the molten alloys were atomized by water atomizing to form powder of averaged particle size 10 µm. The powder was flattened in an attritor, and relation between the period of time for flattening and $O_2$ content in the flattened powder was determined. The results are shown in FIG. 6.

Figure 6:
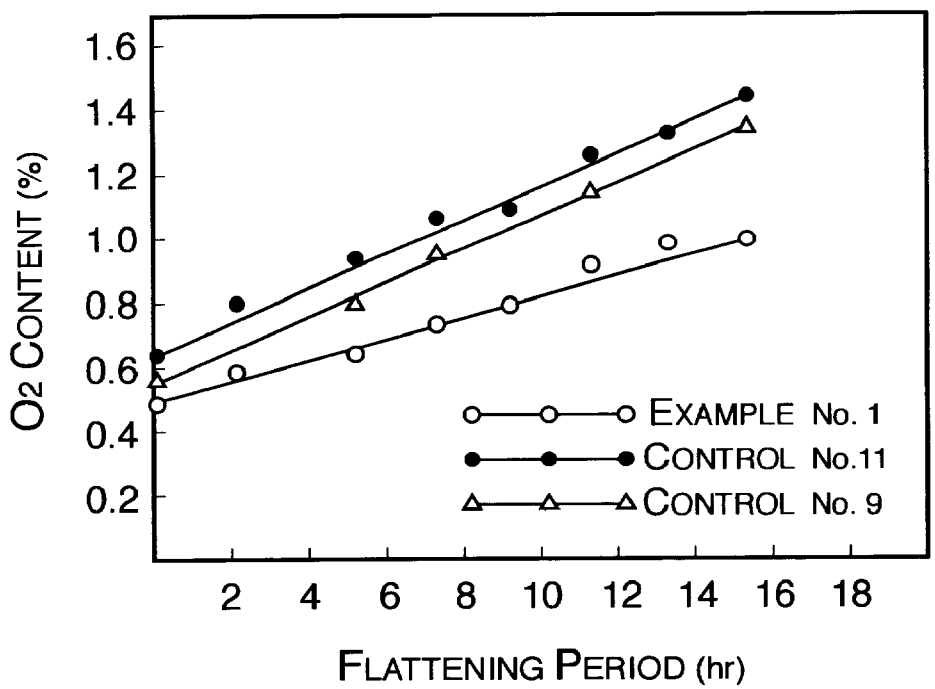
FIG. 6 is a graph showing the relation between the period of time necessary for flattening a present soft magnetic alloy and oxygen contents therein with comparison of a conventional alloy.

From the results in FIG. 6 it is understood that the present powder contains less oxygen than controls Nos. 9 and 11, and that tendency in increase of oxygen content is low in the present powder even after long period of flattening.

Figure 7:
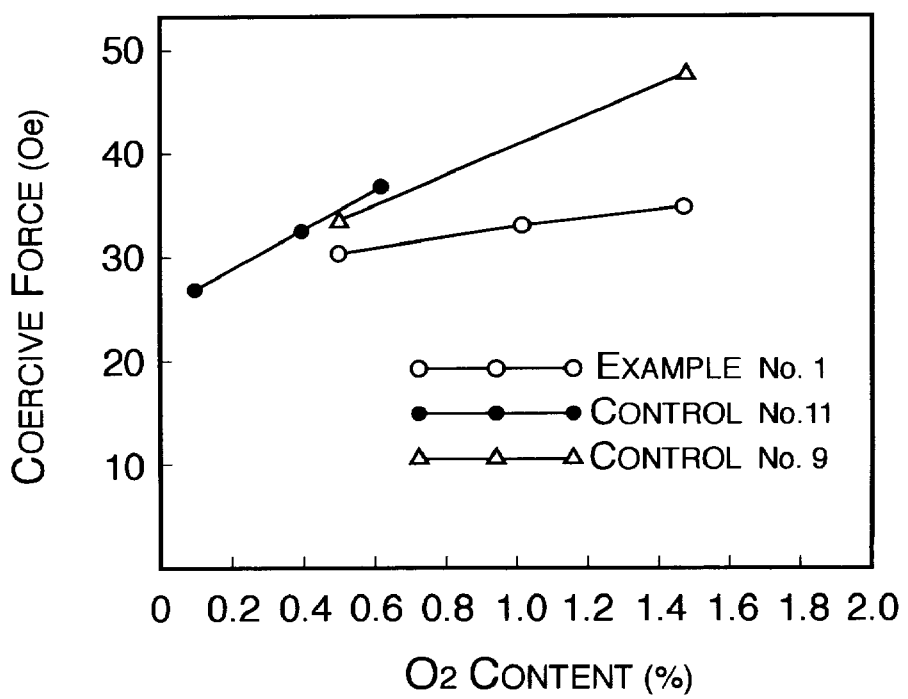
FIG. 7 is a graph showing the relation between oxygen contents and coercive force (Hc) of the present invention with comparison of a conventional alloy.

In regard to Example No. 1, Controls Nos. 9 and 11, relation between the $O_2$ contents before and after flattening and the coercive force (Hc) of the powders was determined. The results are shown in FIG. 7. FIG. 7 shows that the Example No. 1 powder of the invention has a coercive force lower than those of Controls Nos. 9 and 11 even at an equal oxygen content, and that, even at higher oxygen contents, increase in the coercive force remains small.

In summary, it is concluded that the soft magnetic alloy powder of the Example can be flattened in a period of time shorter than that required for the Controls, that oxygen content is low even in an equal period for flattening and that, even at an equal oxygen content the coercive force is low.

Also it is concluded that, at the same aspect ratio, the coercive force of the present soft magnetic powder alloy is lower (permeability is higher). Thus, the present material is suitable as soft magnetic powder for shield.

Example 4

Four soft magnetic alloys having the alloy compositions shown in Table 3 below were prepared and atomized by water atomizing.

TABLE 3

| No. | Cr | Al | Si | REM | Fe | Remarks |
| --- | --- | --- | --- | --- | --- | --- |
| 11 | 7.2 | 9.6 | 0.1 | — | balance | |
| 12 | 3.2 | 9.6 | 3.2 | 0.05 | balance | |
| 13 | 13.0 | 3.0 | 5.0 | — | balance | |
| 14 | — | 5.4 | 9.6 | — | balance | Sendust |

Powders passing 145 mesh sieve were collected. $D_{50}$ of these powders were 10–22 µm.

The powders were charged in a ball mill type attritor (250 rpm) and subjected to wet flattening using a naphthenol as the medium. Samples taken out as the time lapsed were dried at 80° C. for 5 hours and averaged particle size of the powders were determined. The results are shown in FIG. 8.

Figure 8:
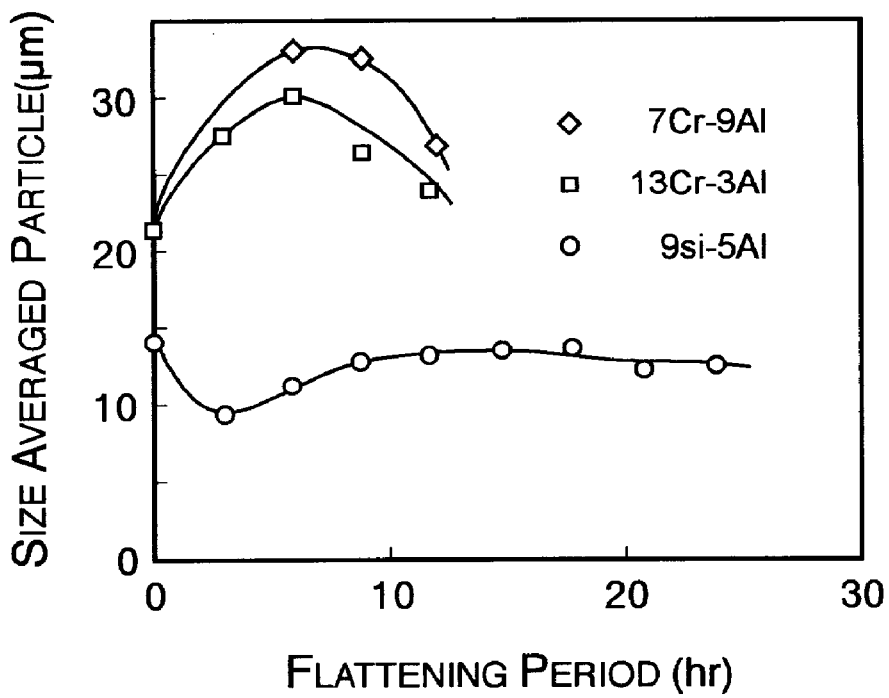
FIG. 8 is a graph showing change in averaged particle size of soft magnetic alloy powder under flattening at lapse of time.

From FIG. 8 it is understood that averaged particle sizes of the powders of two Fe—Cr—Al alloys rapidly increase and then decrease. The increase of the averaged particle size is considered to be the results of flattening of spherical particles and the subsequent decrease of the averaged particle size seems to be caused by minuting the flat, once formed foil-like particles, to smaller particles. On the other hand, Fe—Si—Al alloy (Sendust) conventionally used as a soft magnetic alloy for electromagnetic shield, which is known as a hard material, receive no substantial change in the particle size. Based on these facts it is concluded that, for the purpose of obtaining flat particles, Fe—Cr—Al based soft magnetic alloys are advantageously used.

Example 5

The above mentioned four soft magnetic alloy powders (flattening periods are 6 hours for two Fe—Cr—Al alloys and 20 hours for Fe—Si—Al alloy) were blended with chlorinated polyethylene rubber, to which a flame retarder is added in the amounts of, by weight, 7.5%, 9%, 11% or 12.5%, so that content of the powder may be 90 wt. % of the blend. The blend was then kneaded in a pressure kneading machine, and after rolling in a mixing roller and fine rolling in a calendar roller to form sheets of thickness 0.5 mm.

Figure 9:
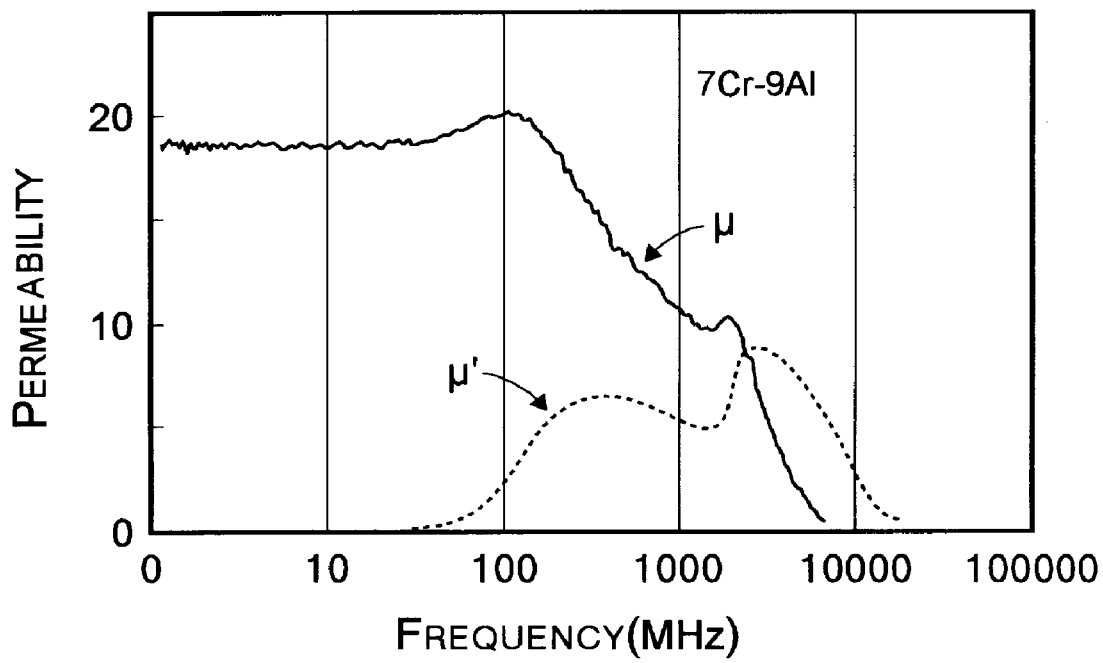
FIG. 9 is a graph showing frequency characteristics of a shielding sheet of the present invention.

Of the shielding sheets thus produced one containing soft magnetic alloy of the composition of Fe—7Cr—9Al was subjected to measurement of frequency characteristics of permeability, and the results of FIG. 9 were obtained. Period of time for flattening was 6 hours and the powder was heat treated in hydrogen atmosphere at 700° C. for 1 hour. FIG. 9 shows that the present sheet for electromagnetic shield retains high permeability even in higher frequency band.

Figure 10:
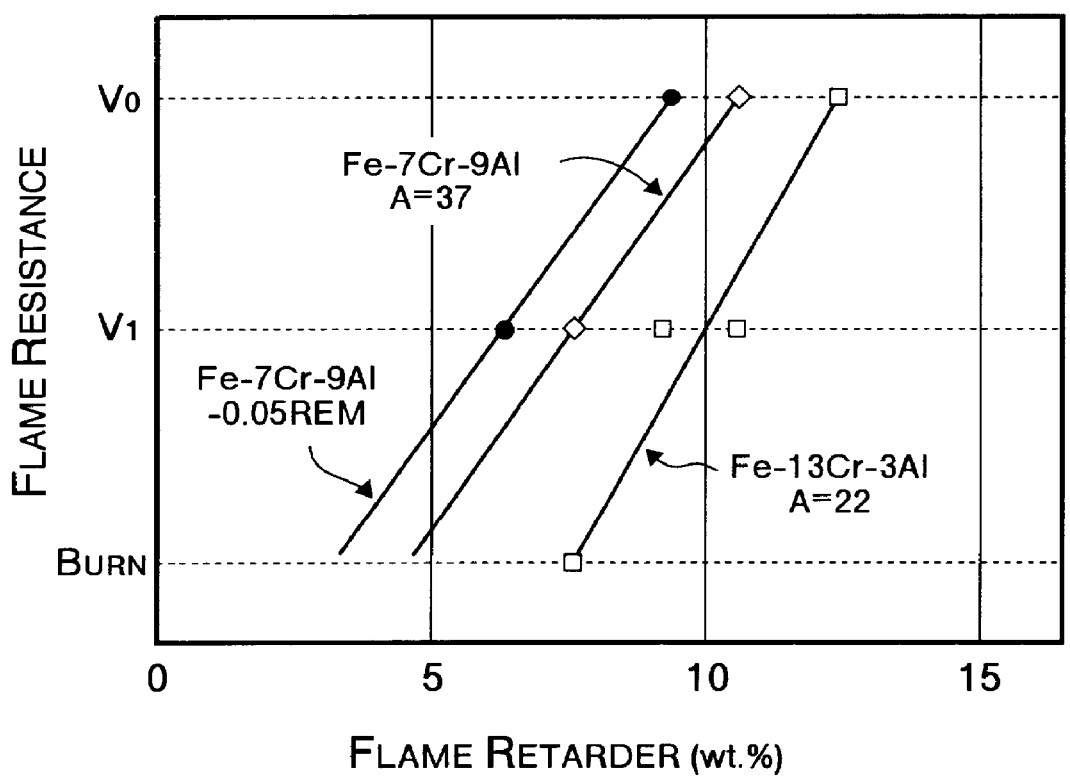
FIG. 10 is a graph showing flame resistance levels of shielding sheets of the present invention determined by the tests according to UL standards in the relation to the quantities of a flame retarder incorporated in the matrix chlorinated polyethylene rubber with comparative data.

Flame resistance of the sheets was determined by the method of UL 94 Standard. Results of evaluation is shown in FIG. 10 with the values of A=Cr %+3Al of the sheets. From the results in FIG. 10 it can be said that flame resistance of higher level is easily attained with a higher "A" value. In other words, addition of even a smaller amount of flame retarder realizes desired flame resistance.

We claim:

1. A soft magnetic alloy powder for electromagnetic and magnetic shield, consisting of, by weight %, Cr: 0.5–20%, Si: 0.001–0.5%, Al: 0.01–20% and the balance of Fe and inevitable impurities.

2. A soft magnetic alloy powder for electromagnetic and magnetic shield, consisting of, by weight %, Cr: 5–14%, Si: 0.01–0.5%, Al: 0.5–20%, wherein the value of Cr %+3Al % is 30 or higher, and the balance of Fe and inevitable impurities.

3. A soft magnetic alloy powder for electromagnetic and magnetic shield, consisting of, by weight %, Cr: 5–14%, Si: 0.01–0.5%, Al: 0.5–20% and REM: up to 0.5%, wherein the value of Cr %+3Al % is 30 or higher, and the balance of Fe and inevitable impurities.

4. A soft magnetic alloy powder for electromagnetic and magnetic shield according to one of claims 1 to 3, wherein the aspect ratio of the powder is 2 or higher.

5. A shielding member for electromagnetic and magnetic shield, prepared by dispersing soft magnetic alloy powder consisting of, by weight %, Cr: 0.5–20%, Si: 0.001–0.5%, Al: 0.01–20% and the balance of Fe and inevitable impurities in a matrix of rubber or plastics and processing to shaped articles.

6. A shielding member for electromagnetic and magnetic shield according to claim 5, wherein the article is in the form of a sheet.

7. A shielding member for electromagnetic and magnetic shield according to claim 6, wherein an adhesive layer is provided on whole or a part of a surface or surfaces of the sheet.

8. A shielding member for electromagnetic and magnetic shield according to claim 6, wherein plural projecting points or lines are formed on whole or a part of a surface or surfaces of the sheet.

9. A flame resistant shielding member for electromagnetic and magnetic shield, prepared by dispersing a soft magnetic alloy powder consisting of, by weight %, Cr: 5–14%, Si: 0.01–0.5%, Al: 0.5–20%, wherein the value of Cr %+3Al % is 30 or higher, and the balance of Fe and inevitable impurities, in a matrix of chlorine-containing rubber or plastics.

10. A flame resistant shielding member for electromagnetic and magnetic shield, prepared by dispersing a soft magnetic alloy powder consisting of, by weight %, Cr: 5–14%, Si: 0.01–0.5%, Al: 0.5–20% and REM: up to 0.5%, wherein the value of Cr %+3Al % is 30 or higher, and the balance of Fe and inevitable impurities, in a matrix of chlorine-containing rubber or plastics.

11. A flame resistant shielding member for electromagnetic and magnetic shield according to claim 9 or claim 10, wherein the soft magnetic alloy powder is flat and the content thereof is, by weight, 30% or higher.

12. A flame resistant shielding member for electromagnetic and magnetic shield according to claim 9 or claim 10, wherein the matrix is a chlorinated rubber or plastic of a flame resistant grade.

13. A flame resistant shielding member for electromagnetic and magnetic shield according to claim 11, wherein the matrix is a chlorinated rubber or plastic of a flame resistant grade.

14. A flame resistant shielding member for electromagnetic and magnetic shield according to claim 9 or claim 10, wherein the member is in the form of a molded article made by injection molding or extrusion molding, or a sheet made by calendering.

15. A flame resistant shielding member for electromagnetic and magnetic shield according to claim 10, wherein the member is in the form of a molded article made by injection molding or extrusion molding, or a sheet made by calendering.

16. A flame resistant shielding member for electromagnetic and magnetic shield according to claim 13, wherein the member is in the form of a molded article made by injection molding or extrusion molding, or a sheet made by calendering.

* * * * *